United States Patent
Song

(10) Patent No.: US 8,566,685 B2
(45) Date of Patent: Oct. 22, 2013

(54) COMMAND CONTROL CIRCUIT, INTEGRATED CIRCUIT HAVING THE SAME, AND COMMAND CONTROL METHOD

(75) Inventor: Choung-Ki Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 314 days.

(21) Appl. No.: 12/981,037

(22) Filed: Dec. 29, 2010

(65) Prior Publication Data

US 2012/0110423 A1    May 3, 2012

(30) Foreign Application Priority Data

Nov. 2, 2010 (KR) .......................... 10-2010-0108105

(51) Int. Cl.
*G06F 11/00* (2006.01)
(52) U.S. Cl.
USPC ................. 714/799; 714/25; 714/52; 714/53; 714/54
(58) Field of Classification Search
USPC .................................. 714/25, 52, 53, 54, 799
See application file for complete search history.

(56) References Cited

U.S. PATENT DOCUMENTS

| 4,369,510 | A  | * | 1/1983  | Johnson et al. ................. 714/49 |
| 6,195,770 | B1 | * | 2/2001  | Walton ............................ 714/53 |
| 7,406,628 | B2 | * | 7/2008  | Edgar et al. ..................... 714/43 |
| 8,307,270 | B2 | * | 11/2012 | Kim et al. ...................... 714/805 |
| 2009/0235113 | A1 | * | 9/2009 | Shaeffer et al. .................... 714/5 |
| 2010/0174951 | A1 | * | 7/2010 | Yamashita et al. .............. 714/54 |
| 2011/0055671 | A1 | * | 3/2011 | Kim et al. ...................... 714/800 |
| 2011/0225478 | A1 | * | 9/2011 | Kimura ......................... 714/799 |

FOREIGN PATENT DOCUMENTS

| KR | 1020040086168 | 10/2004 |
| KR | 1020080074316 | 8/2008  |
| WO | WO 03/071550  | 8/2003  |

OTHER PUBLICATIONS

Office Action issued by the Korean Intellectual Property Office on Jan. 30, 2012.

Notice of Allowance issued by the Korean Intellectual Property Office on Jul. 30, 2012.

* cited by examiner

*Primary Examiner* — Charles Ehne
(74) *Attorney, Agent, or Firm* — IP & T Group LLP

(57) ABSTRACT

A command control circuit includes a command decoder configured to decode a command and generate an internal command, an error check unit configured to detect an error in the command and an address by using check data and generate an error check signal in response to the detection, and a blocking unit configured to block or pass the internal command in response to first and second states of the error check signal.

18 Claims, 3 Drawing Sheets

COMMAND CONTROL CIRCUIT, INTEGRATED CIRCUIT HAVING THE SAME, AND COMMAND CONTROL METHOD

CROSS-REFERENCE TO RELATED APPLICATIONS

The present application claims priority of Korean Patent Application No. 10-2010-0108105, filed on Nov. 2, 2010, which is incorporated herein by reference in its entirety.

BACKGROUND OF THE INVENTION

Exemplary embodiments of the present invention relate to a command control circuit, an integrated circuit having the same, and a command control method.

Parity check refers to a technology for checking whether transmission data has been lost or damaged at the time of data transmission. Other technologies for checking whether transmission data has been lost or damaged at the time of data transmission includes use of cyclic redundancy check (CRC), etc.

In performing a parity check, a parity bit is added to a bit sequence and transmitted. The parity bit is used for checking whether transmitted bits have been successively transferred. An exemplary method for performing parity check is as follows. If the sum of all data bits is even before they are transmitted, a parity bit is set to 1 so that the total sum of the transmitted bits is odd. If the sum of the data bits is already odd, the parity bit is set to 0. A data receiving side checks whether the sum of all bits is odd. If the sum of the bits is even, it represents that an error has occurred during data transmission. Thus, corresponding data is retransmitted or a system is stopped and an error message is sent to a user.

An integrated circuit may use parity check in order to substantially prevent an abnormal operation from being performed due to an error or distortion on an interface. Parity check is used when an error rate is low. An integrated circuit may detect an erroneous command using the parity check.

FIG. 1 is a block diagram of a conventional integrated circuit.

As illustrated in FIG. 1, the integrated circuit includes a command input unit 110, an address input unit 120, a clock buffer 130, a check data input unit 140, an error check unit 150, a synchronization unit 160, a synchronization delay unit 170 and a command decoder 180.

The error check unit checks an error of a command CMD and an address ADD. The synchronization unit 160 allows an error check result to be synchronized with a clock CLK, and includes a pipe latch. The synchronization delay unit 170 delays the command CMD and the address ADD. The command decoder 180 decodes a delay command DEL_CMD to generate an internal command IN_CMD.

The operation of the integrated circuit will be described with reference to FIG. 1 below.

The command input unit 110 receives the command CMD in synchronization with a clock CLK inputted from the clock buffer 130. The command CMD includes a row address strobe (RAS) signal, a column address strobe (CAS) signal, a write enable (WE) signal, and a chip select (CS) signal. The address input unit 120 receives the address ADD in synchronization with the clock CLK. The check data input unit 140 receives check data CHE_DATA in synchronization with the clock CLK.

The synchronization delay unit 170 delays the command CMD and the address ADD in synchronization with the clock CLK to generate the delay command DEL_CMD and a delay address DEL_ADD. In order for the command decoder 180 to determine whether an error exists in the command CMD and the address ADD and generate the internal command IN_CMD, it is desired that the command CMD, the address ADD and an error check signal ERR arrive at the command decoder 180 within a certain window of time. However, since an error check operation of the error check unit 150 takes some time, the command CMD and the address ADD are to be delayed in order to allow the command CMD, the address ADD and the error check signal ERR indicating the presence or absence of an error to arrive at the command decoder 180 simultaneously. Here, the synchronization unit 160 has a delay in transmitting a signal in response to its inputs. Delay information DEL<0:1> is used to determine the delay time of the command CMD and the address ADD. The number of flip-flops 171 to 174 used to delay the command CMD and the address ADD is determined according to the values of the delay information DEL<0:1>.

The error check unit 150 checks whether an error exists in the command CMD and the address ADD by using the check data CHE_DATA, and generates a check result signal CHECK_RES having different values according to an error check result. The error check unit 150 operates asynchronously with the clock CLK and generates a valid signal VALID representing that the error check result is valid.

The synchronization unit 160 stores the check result signal CHECK_RES in response to the valid signal VALID and generates an error check signal ERR by using the check result signal CHECK_RES in response to a delayed internal signal ICST in synchronization with the clock CLK. Here, timing points at which the delay command DEL_CMD and the error check signal ERR reach the command decoder 180 coincide with each other. The internal signal ICST is obtained by delaying the command CMD in synchronization with the clock CLK.

The command decoder 180 decodes the delay command DEL_CMD to generate the internal command IN_CMD. At this time, the decoding operation of the command decoder 180 is performed in synchronization with the clock CLK. When an error exists in the command CMD or the address ADD, the command decoder 180 does not activate the internal command IN_CMD according to the error check signal ERR. When no error exists in the command CMD and the address ADD, the command decoder 180 activates the internal command IN_CMD.

A check operation signal CHECK is used to determine whether to perform the error check operation. When the check operation signal CHECK is deactivated, the error check unit 150 does not operate the error check operation and the synchronization delay unit 170 does not delay the command CMD and the address ADD. The values of the delay information DEL<0:1> and the check operation signal CHECK are determined by MRS setting.

Since the command decoder 180 operates in synchronization with the clock CLK, the delay command DEL_CMD and the error check signal ERR inputted to the command decoder 180 are to be synchronized with the clock CLK. Thus, the synchronization delay unit 170 uses a plurality of flip-flops 171 to 174 in order to delay the command CMD and the address ADD in synchronization with the clock CLK. As the number of commands CMD and addresses ADD is increased, the number of flip-flops for delaying respective ones of the commands CMD and the addresses ADD also increase, and thus an increase in a circuit area and power consumption in implementation may result.

SUMMARY OF THE INVENTION

An embodiment of the present invention is directed to providing an integrated circuit capable of reducing circuit area and power consumption in being implemented.

In accordance with an embodiment of the present invention, a command control circuit includes: a command decoder configured to decode a command and generate an internal command; an error check unit configured to detect an error in the command and an address by using check data and generate an error check signal in response to the detection; and a blocking unit configured to block or pass the internal command in response to first and second states of the error check signal, respectively.

The blocking unit includes a delay section configured to, in an error check mode of the command control circuit, block the internal command when the error exists in the command or the address and delay the internal command to output a delayed command signal in response to an indication in the error check signal that no error exists in the command and the address, and a pass section configured to allow the internal command to bypass the delay section in a non-error check mode of the command control circuit.

In accordance with another embodiment of the present invention, an integrated circuit includes: a command input unit configured to receive a command; an address input unit configured to receive an address; a check data input unit configured to receive check data; a command decoder configured to decode the command and generate an internal command; an error check unit configured to detect an error of the command and the address by using the check data and generate an error check signal in response to the detection; and a blocking unit configured to block or pass the internal command in response to first and second states of the error check signal, respectively.

In accordance with further another embodiment of the present invention, a command control method includes: decoding a command to generate an internal command; determining whether an error exists in the command and an address; and blocking the internal command when an error exists in the command or the address, and delaying the internal command by a first delay to output a delayed command signal when no error exists in the command and the address.

DESCRIPTION OF SPECIFIC EMBODIMENTS

Figure 1:
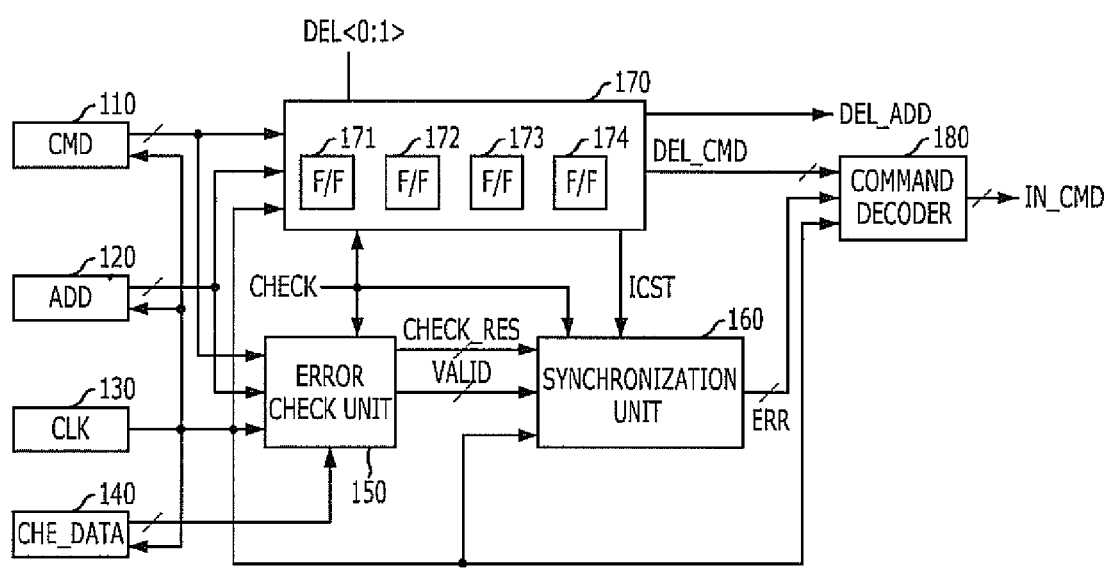
FIG. 1 is a block diagram of a conventional integrated circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
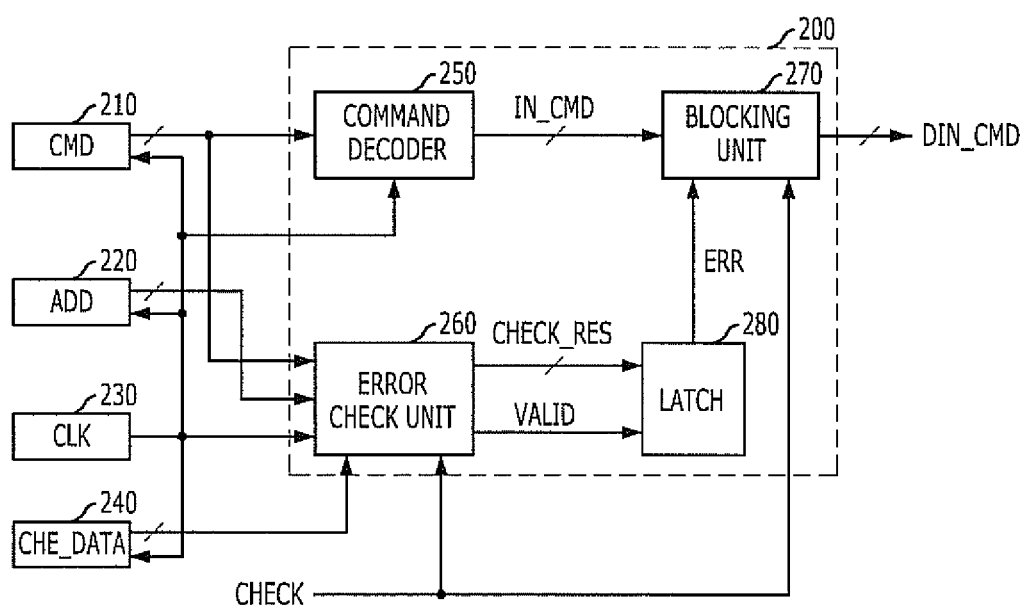
FIG. 2 is a block diagram of an integrated circuit in accordance with an embodiment of the present invention.

FIG. 2 is a block diagram of an integrated circuit in accordance with an embodiment of the present invention.

Referring to FIG. 2, the integrated circuit includes a command input unit 210, an address input unit 220, a clock buffer 230, a check data input unit 240, a command decoder 250, an error check unit 260, a blocking unit 270 and a latch 280.

The command input unit receives a command CMD, and the address input unit 220 receives an address ADD. The clock buffer 230 receives a clock CLK, and the check data input unit 240 receives check data CHE_DATA. The command input unit 210, the address input unit 220, and the check data input unit 240 include buffers for receiving the command CMD, the address ADD and check data CHE_DATA, and latch circuits for latching the command CMD, the address ADD and check data CHE_DATA, respectively. The check data CHE_DATA is inputted from the outside of the integrated circuit through a separate pad.

The command decoder 250 decodes the command CMD to generate an internal command IN_CMD. The error check unit 260 checks an error of the command CMD and the address ADD. The blocking unit 270 blocks or passes the internal command IN_CMD according to an error check result CHECK_RES of the error check unit 260. The latch 280 stores a check result signal CHECK_RES when a valid signal VALID is activated and transferring the check result signal CHECK_RES as an error check signal ERR.

The operations of the integrated circuit and a command control circuit 200 included in the integrated circuit are as follows.

The integrated circuit is configured to perform an error check operation for the command CMD when a check operation signal CHECK is activated and does not perform the error check operation for the command CMD when the check operation signal CHECK is deactivated. Hereinafter, a case where the error check operation is performed is referred to as "a check mode" and a case where the error check operation is not performed is referred to as "a non-check mode". The error check operation is performed in response to the check operation signal CHECK and whether to perform the error check operation is determined by MRS setting, where the check operation signal CHECK is generated by decoding MRS setting information.

The operation of the "check mode" will be described below.

The command input unit 210, the address input unit 220, and the check data input unit 240 are configured to receive the command CMD, the address ADD and the check data CHE_DATA in synchronization with the clock CLK inputted from the clock buffer 230, respectively. The command CMD may be a signal including a row address strobe (RAS) signal, a column address strobe (CAS) signal, a write enable (WE) signal, and a chip select (CS) signal. An operation to be performed by the integrated circuit is determined according to a combination of the above commands CMD.

The error check unit 260 is configured to check whether an error exists in the command CMD and the address ADD by using the check data CHE_DATA. Activation (that is, a logic high level) of the check result signal CHECK_RES indicates the presence of an error and deactivation (that is, a logic low level) of the check result signal CHECK_RES indicates the absence of the error. The check data CHE_DATA corresponds to, for example, a parity data, where a parity data bit (that is, 1-bit check data CHE_DATA) matches with a set of a command CMD for an operation (e.g., a read operation, a write operation and the like) and a corresponding address ADD.

When the valid signal VALID indicating the validity of the check result signal CHECK_RES of the error check unit 260 is activated (for example, a logic high level), the latch 280 receives and stores the check result signal CHECK_RES and transfers the check result signal CHECK_RES as the error check signal ERR. The error check signal ERR has a logic value substantially equal to that of the check result signal CHECK_RES.

The command decoder 250 is configured to decode the command CMD and generate the internal command IN_CMD. The command decoder 250 decodes the command CMD in synchronization with the clock CLK. The internal command IN_CMD may be any reasonably suitable command signal including an active command Active, a precharge command Precharge, an auto-refresh command Auto Refresh, etc, that are generated in response to the command CMD. The core of the integrated circuit performs a read operation, a write operation, a precharge operation, a refresh operation and the like in response to the internal command IN_CMD.

The blocking unit 270 is configured to block the internal command IN_CMD when an error exists in the command CMD, and delay the internal command IN_CMD by an appropriate delay and output a delayed signal when no error is determined to exist in the command CMD in response to the error check signal ERR. Hereinafter, the signal generated by delaying the internal command IN_CMD will be referred to as a delayed internal command DIN_CMD. In blocking the internal command IN_CMD, the blocking unit 270 deactivates the delayed internal command DIN_CMD regardless of the internal command IN_CMD. The delay through the blocking unit 270 may equal to a delay of the error check unit 260 in generating output signals in response to input signals of the error check unit 260.

The blocking unit 270 is configured to operate asynchronously with the clock CLK. The reason that the blocking unit 270 operates asynchronously with the clock CLK is as follows. Since the command decoder 250 is to operate in synchronization with the clock CLK, the input of the command decoder 250 is synchronized with the clock CLK. However, since the blocking unit 270 is placed next to the command decoder 250, no problem occurs even if the output DIN_CMD of the blocking unit 270 is not synchronized with the clock CLK. In this regard, an asynchronous delay circuit is used as a delay circuit for delaying the internal command IN_CMD within the blocking unit 270. Since it is not necessary to use the plurality of flip-flops (for example, the flip-flops 171 to 174 in FIG. 1) for delaying a command in producing the internal command IN_CMD in synchronism with the clock CLK, the circuit area and the power consumption of the implemented integrated circuit are significantly reduced. Here, only one latch 280 (that is, as opposed to a pipe latch such as the synchronization unit 160 in FIG. 1) is used in generating the error check signal ERR. Thus, the circuit area of the implemented integrated circuit is reduced.

The operation of the "non-check mode" of the integrated circuit is as follows.

In the "non-check mode", the error check unit 260 does not check for an error in the command CMD. Furthermore, the blocking unit 270 allows the internal command IN_CMD to pass therethrough without blocking or delaying of the internal command IN_CMD. Accordingly, the delayed internal command DIN_CMD is output by delaying the internal command IN_CMD through two NAND gates included in the blocking unit 270. Thus, in the "non-check mode", regardless of whether an error exists in the command CMD, the internal command IN_CMD corresponding to the command CMD is activated and the delayed internal command DIN_CMD is activated.

FIG. 2 illustrates the integrated circuit in accordance with the embodiment of the present invention, and the command control circuit 200 in accordance with the embodiment of the present invention corresponds to a part of the integrated circuit. The command control circuit 200 includes the command decoder 250, the error check unit 260 and the blocking unit 270, and the operation of the command control circuit 200 has been described above.

Figure 3:
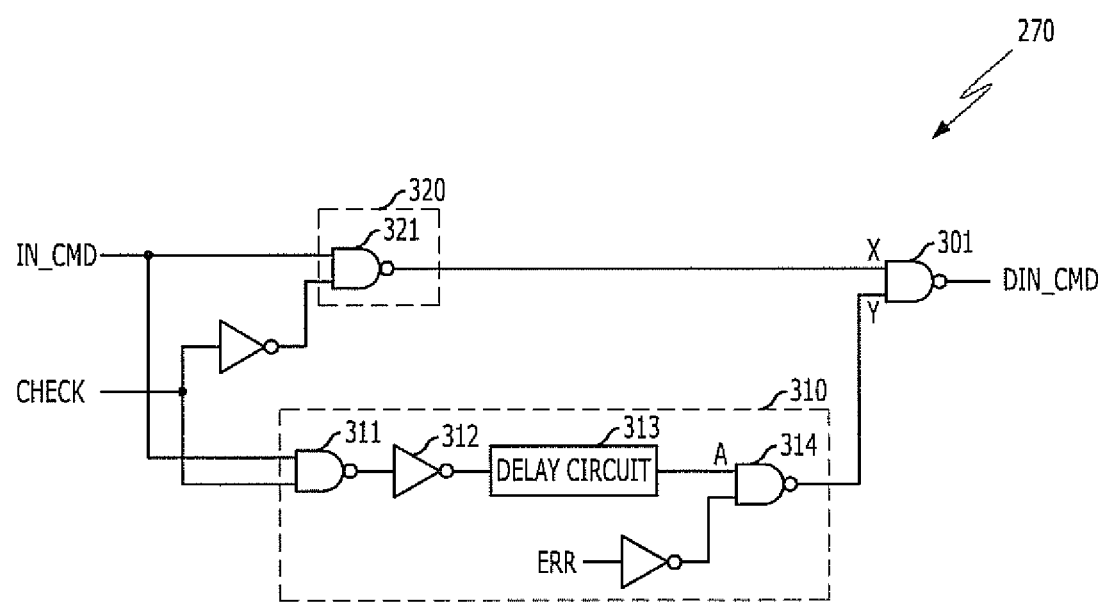
FIG. 3 is a block diagram of a blocking unit in accordance with an embodiment of the present invention.

FIG. 3 is a block diagram of the blocking unit 270 in accordance with the embodiment of the present invention.

Referring to FIG. 3, the blocking unit 270 includes a delay section 310 and a pass section 320. The delay section 310 is configured to block the internal command IN_CMD when an error exists in the command CMD in an error check mode, delay the internal command IN_CMD by an appropriate delay and output a delayed signal when no error exists in the command CMD. The pass section 320 is configured to allow the internal command IN_CMD to pass therethrough in a non-error check mode.

The operation of the "check mode" of the integrated circuit will be described below.

In the "check mode", since the check operation signal CHECK is at a logic high level, a first NAND gate 321 of the pass section 320 outputs a logic high signal regardless of the activation of the internal command IN_CMD. A second NAND gate 311 of the delay section 310 inverts and outputs the internal command IN_CMD. The output of the second NAND gate 311 is delayed by a delay circuit 313 via an inverter 312. The delay circuit 313 is an asynchronous delay circuit and a delay value of the delay circuit 313 corresponds to an operation time of the error check unit 260 in receiving its inputs and outputting its outputs so that the error check signal ERR is delayed in being outputted by the error check operation time of the error check unit 260. The blocking unit 270 properly blocks the internal command IN_CMD or allows the internal command IN_CMD to pass therethrough in response to an error check result only when the error check signal ERR and the internal command IN_CMD are simultaneously inputted to a third NAND gate 314 within an appropriate period.

The error check result is indicated by a logic value of the error check signal ERR. Referring to FIG. 3, when the error check signal ERR is at a logic high level, it indicates that an error exists. When the error check signal ERR is at a logic low level, it indicates that no error exists. When the error check signal ERR is at the logic high level, the output of the third NAND gate 314 is always at a logic high level. When the error check signal ERR is at the logic low level, the third NAND gate 314 inverts and outputs first input A inputted thereto.

An output NAND gate 301 receives the output of the first NAND gate 321 as first input X and the output of the third NAND gate 314 as second input Y. As described above, since the first input X is at a logic high level, the output NAND gate 301 inverts the second input Y to generate the delayed internal command DIN_CMD.

Accordingly, when the error exists in the command CMD, the delayed internal command DIN_CMD is deactivated (that is, a logic low signal). When no error exists in the command CMD, the delayed internal command DIN_CMD indicates a signal obtained by delaying the internal command IN_CMD by the operation time of the error check unit 260.

The operation of the "non-check mode" will be described below.

In the "non-check mode", since the check operation signal CHECK is at a logic low level, the first NAND gate 321 inverts and outputs the internal command IN_CMD. The output of the second NAND gate 311 is always at a logic high level and the output of the third NAND gate 314 is also always at a logic high level. Thus, the output NAND gate 301 inverts the first input X, which is the output of the first NAND gate 321, to generate the delayed internal command DIN_CMD. The delayed internal command DIN_CMD indicates a signal obtained by delaying the internal command IN_CMD by a delay equal to the delay of internal command IN_CMD through the first NAND gate 321 and the output NAND gate 301.

A command control method in accordance with the embodiment of the present invention is described with reference to FIGS. 2 and 3 as follows.

The command control method in accordance with the embodiment of the present invention includes generating the internal command IN_CMD by decoding the command CMD, checking whether an error exists in the command CMD and the address ADD by using the check data CHE_DATA, and blocking the internal command IN_CMD when an error exists in the command CMD or the address ADD and delaying the internal command IN_CMD by an appropriate delay and outputting a delayed signal when no error exists in the command CMD and the address ADD.

The generating of the internal command IN_CMD is performed in synchronization with the clock CLK and the blocking or passing of the internal command IN_CMD is performed without an input of the clock CLK. A delay in generating internal command IN_CMD is equal to a time for performing the checking of whether the error exists in the command CMD and the address ADD by the error checking unit 260.

A period during which the generating of the internal command IN_CMD is performed overlaps a period during which the checking of whether the error exists in the command CMD and the address ADD is performed. According to an example, the two steps start at the same timing.

An integrated circuit in accordance with the invention performs an operation for blocking or passing an internal command without a synchronizing clock according to whether an error exists in a command or an address, thereby reducing a circuit area and power consumption in being implemented.

While the present invention has been described with respect to the specific embodiments, it will be apparent to those skilled in the art that various changes and modifications may be made without departing from the spirit and scope of the invention as defined in the following claims.

What is claimed is:

1. A command control circuit comprising:
   a command decoder configured to decode a command and generate an internal command;
   an error check unit configured to detect an error in the command and an address by using check data and generate an error check signal in response to the detection; and
   a blocking unit configured to block or pass the internal command in response to first and second states of the error check signal, respectively.

2. The command control circuit of claim 1, wherein the command decoder is configured to operate synchronously with a clock and the blocking unit is configured to operate asynchronously with the clock.

3. The command control circuit of claim 1, wherein the blocking unit is configured to block the internal command in response to an indication in the error check signal that an error exists in the command or the address and delay the internal command by a first delay to output a delayed command signal in response to an indication in the error check signal that no error exists in the command and the address.

4. The command control circuit of claim 3, wherein the first delay is equal to a time required by the error check unit for performing the checking of whether an error exists in the command.

5. The command control circuit of claim 1, wherein the error check unit is configured to check an error of the command in an error check mode of the command control circuit and not check the error of the command in a non-error check mode of the command control circuit.

6. The command control circuit of claim 1, wherein the blocking unit comprises:
   a delay section configured to, in an error check mode of the command control circuit, block the internal command when the error exists in the command or the address and delay the internal command to output a delayed command signal in response to an indication in the error check signal that no error exists in the command and the address; and
   a pass section configured to allow the internal command to bypass the delay section in a non-error check mode of the command control circuit.

7. The command control circuit of claim 1, wherein the command is at least one of a row address strobe signal, a column address strobe signal, a write enable signal, and a chip select signal.

8. The command control circuit of claim 1, wherein the error check unit is configured to receive a clock signal, operate synchronously with the clock signal, and the blocking unit is configured to operate asynchronously with the clock signal.

9. The command control circuit of claim 1, further comprising a latch configured to store the error check signal in response to a valid signal that is received from the error check unit and indicates that the error check signal is valid.

10. An integrated circuit comprising:
    a command input unit configured to receive a command;
    an address input unit configured to receive an address;
    a check data input unit configured to receive check data;
    a command decoder configured to decode the command and generate an internal command;
    an error check unit configured to detect an error of the command and the address by using the check data and generate an error check signal in response to the detection; and
    a blocking unit configured to block or pass the internal command in response to first and second states of the error check signal, respectively.

11. The integrated circuit of claim 10, further comprising:
    a clock buffer configured to receive a clock.

12. The integrated circuit of claim 11, wherein the command decoder is configured to operate synchronously with the clock and the blocking unit is configured to operate asynchronously with the clock.

13. The integrated circuit of claim 10, wherein the blocking unit is configured to block the internal command in response to an indication in the error check signal that an error exists in the command or the address and delay the internal command by a first delay to output a delayed signal in response to an indication in the error check signal that no error exists in the command and the address.

14. The integrated circuit of claim 10, wherein the first delay is equal to a time required by the error check unit for performing the checking of whether an error exists in the command.

15. A command control method comprising:
    decoding a command to generate an internal command;
    determining whether an error exists in the command and an address;

blocking the internal command when an error exists in the command or the address; and delaying the internal command by a first delay to output a delayed command signal when no error exists in the command and the address.

16. The command control method of claim 15, wherein the generating of the internal command is performed synchronously with the clock and the blocking and delaying of the internal command are performed asynchronously with the clock.

17. The command control method of claim 15, wherein the first delay is equal to a time required for performing the checking of whether an error exists in the command.

18. The command control method of claim 15, wherein a period during which the generating of the internal command is performed overlaps with a period during which the checking of whether an error exists in the command.

\* \* \* \* \*